(12) United States Patent
Sakai

(10) Patent No.: US 7,105,049 B2
(45) Date of Patent: Sep. 12, 2006

(54) METHOD OF MANUFACTURING SINGLE CRYSTAL CALCIUM FLUORIDE

(75) Inventor: Keita Sakai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 436 days.

(21) Appl. No.: 10/657,166

(22) Filed: Sep. 9, 2003

(65) Prior Publication Data

US 2004/0050318 A1    Mar. 18, 2004

(30) Foreign Application Priority Data

Sep. 12, 2002    (JP)    ............... 2002-266905

(51) Int. Cl.
*F27B 5/08*    (2006.01)
(52) U.S. Cl. .......................... 117/3; 117/204
(58) Field of Classification Search .............. 117/3, 117/204
See application file for complete search history.

(56) References Cited

U.S. PATENT DOCUMENTS

| | | | |
|---|---|---|---|
| 6,332,922 B1 | 12/2001 | Sakuma et al. | 117/3 |
| 6,624,390 B1* | 9/2003 | Motakef et al. | 219/407 |
| 2002/0182863 A1 | 12/2002 | Chiba | 438/689 |

FOREIGN PATENT DOCUMENTS

| | | |
|---|---|---|
| JP | 11-240787 | 9/1999 |
| JP | 11-240798 | 9/1999 |

* cited by examiner

*Primary Examiner*—Tim Heitbrink
(74) *Attorney, Agent, or Firm*—Fitzpatrick, Cella, Harper & Scinto

(57) ABSTRACT

A method for manufacturing calcium fluoride single crystal includes the step of cooling the calcium fluoride single crystal so that maximum shear stress inside the calcium fluoride single crystal caused by thermal stress is approximately equal to or smaller than critical resolved shear stress ($\tau_c$) in a <1 1 0> direction of on a {0 0 1} plane of the calcium fluoride single crystal.

5 Claims, 10 Drawing Sheets

METHOD OF MANUFACTURING SINGLE CRYSTAL CALCIUM FLUORIDE

This application claims a benefit of foreign priority based on Japanese Patent Application No. 2002-266905, filed on Sep. 12, 2002, which is hereby incorporated by reference herein in its entirety as if fully set forth herein.

BACKGROUND OF THE INVENTION

The present invention relates to a method for manufacturing calcium fluoride ("$CaF_2$") single crystal and $CaF_2$ single crystal. The present invention also relates to an optical system that uses, as a light source, ultraviolet light from excimer laser, such as KrF, ArF, $F_2$ and $Ar_2$, and an exposure apparatus for manufacturing semiconductors and a device fabrication method.

No end to a demand for higher integration of semiconductor integrated circuits has required higher level performance for an exposure apparatus, particularly that of a projection optical system. While resolution in the exposure apparatus may improve along with an increased numerical aperture ("NA") of the projection optical system, the higher NA makes a depth of focus smaller. Thus, NA cannot be increased beyond a predetermined amount, and a shorter wavelength is required for higher resolution.

While the excimer laser, such as KrF (having a wavelength of 248 nm), ArF (having a wavelength of 193 nm) and $F_2$ (having a wavelength of 157 nm), has been regarded as a prospective light source for future exposure apparatuses for this reason, most conventionally used glass materials are not compatible with a shortened wavelength of the light source. Fluoride crystal is used as a lens material, and $CaF_2$ crystal etc. have been developed. A single crystal type $CaF_2$ is used for exposure apparatuses so as to eliminate influence of grain boundary and crystal orientation; $CaF_2$ single crystal having a predetermined size generally grows in a single crystal growth furnace.

While $CaF_2$ for exposure apparatuses requires high quality in aspects of light transmission performance, durability, large aperture, uniform refractive index, birefringence, etc., the most concerned issue is to reduce birefringence. Preferably, the birefringence of $CaF_2$ has a difference in optical path is below 1 nm cm for exposure apparatuses.

It is known that annealing after crystal growth is effective in reducing birefringence in grown $CaF_2$ single crystal. This process may reduce the birefringent index by heating and maintaining $CaF_2$ at high temperature above 1000° C. However, when a cooling process after annealing provides rapid cooling, the birefringent index disadvantageously increases again and thus the cooling rate should be made low. On the other hand, the low cooling rate itself would lead to long processing time and remarkably deteriorate productivity. Therefore, an optimization of the cooling rate is important.

Optimal cooling rates for various sized $CaF_2$, which have been calculated by empirical rules to maintain low birefringent index, are disclosed in Japanese Patent Applications Publications Nos. 11-240798 and 11-240787. In this case, such cooling is also disclosed as means for increased productivity which combines some cooling rates that have been empirically obtained for respective temperature regions, by paying attention to a fact that an increase of the birefringent index at low temperature is less than at high temperature even when $CaF_2$ is cooled at a large cooling rate.

However, an approach that uses an empirical rule to obtain cooling rates that do not cause birefringence for various differently sized $CaF_2$ is disadvantageous in that it is difficult to stably provide manufactured $CaF_2$ with good quality. In addition, it is necessary to arduously determine proper cooling rates for each size of $CaF_2$ single crystal to be processed. Problematically, it is difficult to confirm that no birefringence occurs after processing, the quality becomes instable, and excessive low cooling rate would lower the productivity.

In addition, the birefringence would occur and the productivity would lower without proper cooling even in a process that associates with heating other than annealing after $CaF_2$ single crystal growth. The conventional empirical approach has been hard to design a process that serves to stably provide low birefringence and high productivity.

SUMMARY OF THE INVENTION

Accordingly, it is an exemplified object of the present invention to provide a manufacture method that manufactures $CaF_2$ with stable quality and good productivity irrespective of sizes of $CaF_2$ by taking into account a mechanism that increases the birefringent index of cooling process and by clarifying a basic cooling condition that does not generate birefringence.

Another exemplary object of the present invention is to provide $CaF_2$ single crystal with high quality manufactured by the above manufacture method.

Still another exemplary object of the present invention is to provide $CaF_2$ single crystal that may be manufactured with high quality and good productivity even when its size is so large that the birefringence is likely to increase.

Yet another exemplary object of the present invention is to provide a high-performance optical system that uses thus provided $CaF_2$, an exposure apparatus that uses the optical system, and a device fabrication method that uses the exposure apparatus for a device fabrication process.

Earnest and extensive studies of cause of an increase of birefringent index in a cooling process in order to solve these problems have discovered that a slip occurs on a given crystal plane in $CaF_2$ due to the thermal stress that is generated by a temperature gradient in $CaF_2$ in the cooling process, the strain caused by this slip results in residual stress after cooling, and so-called stress birefringence occurs consequently. Therefore, instant inventors have identified a slip direction and a slip plane that generates the slip during cooling in $CaF_2$ crystal, and precisely measured critical resolved shear stress as necessary shear stress to cause slip for each temperature in the cooling process.

A method of one aspect according to the present invention for manufacturing calcium fluoride single crystal includes the step of cooling the calcium fluoride single crystal so that maximum shear stress inside the calcium fluoride single crystal caused by thermal stress is approximately equal to or smaller than critical resolved shear stress ($\tau_c$) in a <1 1 0> direction of on a {0 0 1} plane of the calcium fluoride single crystal.

A method of another aspect according to the present invention for manufacturing calcium fluoride single crystal includes the step of cooling the calcium fluoride single crystal with variable cooling rates so that throughout temperature in the cooling step, maximum shear stress inside the calcium fluoride single crystal caused by thermal stress is approximately equal to or smaller than critical resolved shear stress ($\tau_c$) in a <1 1 0> direction of on a {0 0 1} plane of the calcium fluoride single crystal and maintained to be an approximately constant ratio.

A method of another aspect according to the present invention for manufacturing calcium fluoride single crystal includes the step of cooling the calcium fluoride single crystal so that maximum shear stress inside the calcium fluoride single crystal caused by thermal stress is 1.2 times as large as critical resolved shear stress ($\tau_c$) or smaller in a <1 1 0> direction of on a {0 0 1} plane of the calcium fluoride single crystal.

A method of another aspect according to the present invention for manufacturing calcium fluoride single crystal includes the step of cooling the calcium fluoride single crystal with variable cooling rates so that throughout temperature in the cooling step, maximum shear stress inside the calcium fluoride single crystal caused by thermal stress is 1.2 times as large as critical resolved shear stress ($\tau_c$) or smaller in a <1 1 0> direction of on a {0 0 1} plane of the calcium fluoride single crystal and maintained to be an approximately constant ratio.

The cooling step may be included in a cooling step after crystal growth, a cooling step after mechanical processing of crystal, a cleansing step of a crystal surface, or a step of coating to a crystal surface.

A crystal growth apparatus of another aspect according to the present invention includes a cooling mechanism necessary to execute the above method, an anneal apparatus for annealing grown calcium fluoride single crystal, which includes a cooling mechanism necessary to execute the above method, an antireflection coating forming apparatus including a cooling mechanism necessary to execute the above method, and calcium fluoride single crystal manufactured by the above method may constitute other aspects according to the present invention.

Calcium fluoride single crystal for photolithography of another aspect according to the present invention has critical resolved shear stress ($\tau_c$) in a <1 1 0> direction of on a {0 0 1} surface of the calcium fluoride single crystal approximately equal to or smaller than shear stress ($\tau$) expressed by $\tau = 1.5E-2 \cdot \exp(3E3 \cdot T^{-1})$, where $\tau$ is shear stress (MPa) and T is average temperature (K) of the calcium fluoride. The calcium fluoride single crystal for photolithography may have a diameter having Φ 300 mm or larger is used for a specific wavelength band less than 160 nm. The calcium fluoride single crystal may further include one or more types of additional elements with concentration of 20 ppm or larger. The additional elements include strontium of concentration of 20 to 600 ppm.

A method of another aspect according to the present invention improves critical resolved shear stress of each slip system in the calcium fluoride single crystal by adding an additional element. The additional element may include strontium.

An optical system of another aspect according to the present invention includes an optical element made of the above calcium fluoride single crystal. An exposure apparatus of another aspect according to the present invention includes an optical system.

A device fabrication method of another aspect of this invention includes the steps of exposing a plate by using the above exposure apparatus, and performing a predetermined process for the exposed object. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the embodiments with reference to accompanying drawings.

DETAILED DESCRIPTION OF THE PREFERRED EMBODIMENTS

A description will be given of embodiments of the present invention.

Review of Slip System in Calcium Fluoride and Application to Manufacture Process The following verification tests were conducted in order to identify conditions under which a slip occurs in CaF$_2$ single crystal during cooling.

Critical resolved shear stress (abbreviated as "CRSS" hereinafter) in the CaF$_2$ slip system was initially reviewed so as to primarily confirm the slip system and obtain temperature dependency of CRSS. CaF$_2$ used for confirmation is a standard sample manufactured by annealing single crystal grown in a manufacture process which is described later, and by cooling the resultant product at a low cooling rate about half the usual product in the cooling process so as to eliminate the residual strain. Table 1 shows major impurity elements included in CaF$_2$. Strontium among the impurity elements was added as strontium fluoride when single crystal grows:

TABLE 1

| (ppm) | | | | | | | |
|---|---|---|---|---|---|---|---|
| Na | Mn | Fe | Y | Ce | Ba | Mg | Sr |
| <0.1 | <0.1 | 0.2 | <0.01 | <0.01 | 0.9 | 1.2 | 100 |

A research result has unveiled that a primary slip system in $CaF_2$ is $\{0\ 0\ 1\}<1\ 1\ 0>$, and a secondary slip system is $\{1\ 1\ 0\}<1\ -1\ 0>$. It has been also unveild that CRSS of each temperature in each slip system may be expressed by the Arrhenius equation, and all the deformations occur in a thermal activation process. A detailed research result will be given below.

A slip surface was recognized by compressing the rectangular-parallelopiped sample having a certain crystal orientation at room temperature and by bifacial-observing slip lines that appear on side surfaces. At this time, a strain speed of the sample was set to be sufficiently low, i.e., down to about 0.01%/sec so as to realize a static stress state at the time of actual cooling.

As result of test, it was confirmed that an active slip system existed on a $\{0\ 0\ 1\}$ surface given a compression in a $<1\ 1\ 1>$ direction since an angle between a slip line and a compression axis was 55° on the $\{1\ 1\ 0\}$ surface, and 39° on a $\{1\ 1\ 2\}$ surface. Similarly, it was confirmed that an active slip system existed on a $\{1\ 1\ 0\}$ surface given a compression in the $<1\ 0\ 0>$ direction. It was confirmed that Burgers vectors of a slip direction was expressed by $<1\ 1\ 0>$ both on the $\{0\ 0\ 1\}$ and $\{1\ 1\ 0\}$ surfaces calculated as a result of an observation of a dislocation of on each slip surface using a transmission type electron microscope. Therefore, it was discovered that the major active slip systems in $CaF_2$ were on $\{0\ 0\ 1\}<1\ 1\ 0>$ and $\{1\ 1\ 0\}<1\ -1\ 0>$. In an attempt to calculate CRSS by taking into consideration Schmidt factor for each slip system, it was found that the former was the primary slip system that worked with lower shear stress and the latter was the secondary slip system.

Figure 1:
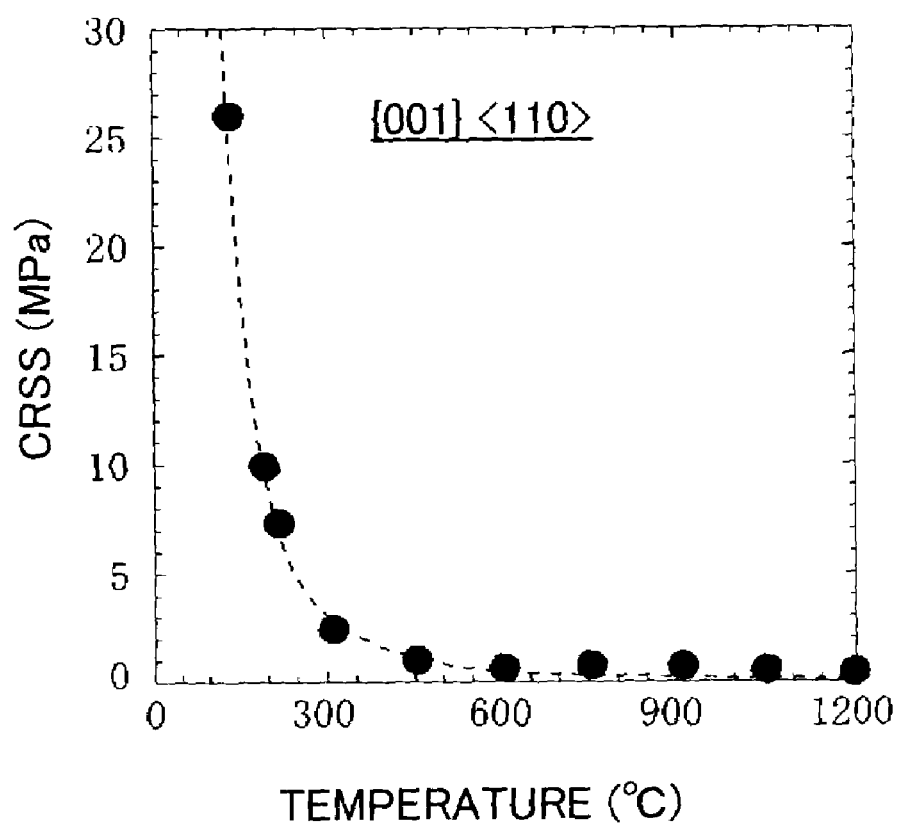
FIG. 1 is a graph showing exemplary critical resolved shear stress for each temperature in a {0 0 1}<1 1 0> slip system of CaF$_2$ single crystal measured by the present invention.

In order to calculate CRSS in each slip system for each temperature during the cooling process, the above compression test was conducted from 200° C. to 1200° C. in an Ar atmosphere. FIG. 1 shows CRSS for each temperature with respect to the primary slip system ($\{0\ 0\ 1\}<1\ 1\ 0>$) calculated by the test. The temperature dependence of CRSS calculated by the test may be expressed in the form of the Arrhenius equation that indicates a general temperature dependency in a thermal activation process, and it is expected that deformations of $CaF_2$ result from the thermal activation process. The temperature dependency of CRSS shown in FIG. 1 is expressed by the following equation:

$$\tau_c^{1st} = 1.5E-2 \cdot \exp(3E3 \cdot T^{-1}) \quad (1)$$

where $\tau_c$ is CRSS [MPa] and T is temperature [K].

Figure 2:
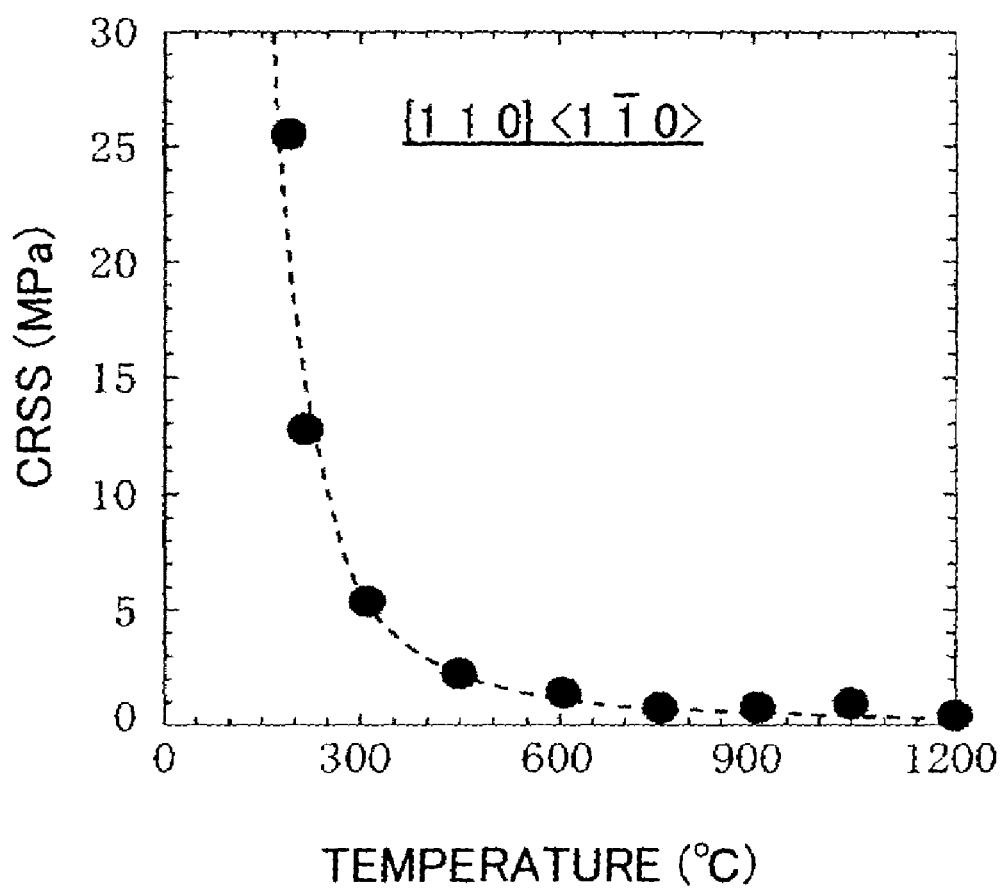
FIG. 2 is a graph showing exemplary critical resolved shear stress for each temperature in a {1 1 0}<1 −1 0> slip system of CaF$_2$ single crystal measured by the present invention.

FIG. 2 shows temperature dependency of CRSS with respect to the secondary slip system ($\{1\ 1\ 0\}<1\ -1\ 0>$) calculated by the test. It is also expected that the secondary slip system occurs in the thermal activation process due to the temperature dependency of CRSS. The temperature dependency of CRSS shown in FIG. 2 is expressed as follows:

$$\tau_c^{2nd} = 2.9E-2 \cdot \exp(3E3 \cdot T^{-1}) \quad (2)$$

where $\tau_c$ is CRSS [MPa] and T is temperature [K].

According to the comparison between FIGS. 1 and 2, the $\{0\ 0\ 1\}<1\ 1\ 0>$ slip system always has smaller CRSS than the $\{1\ 1\ 0\}<1\ -1\ 0>$ slip system, and thus control over cooling may restrain slip of $CaF_2$ and increase of birefringence by maintaining the shear stress due to thermal stress generated in $CaF_2$ during the cooling process within a value lower than CRSS of the $\{0\ 0\ 1\}<1\ 1\ 0>$ slip system shown in FIG. 1.

A description will be given of a method for obtaining a temperature distribution inside $CaF_2$ during the cooling process after annealing, etc., and for calculating shear thermal stress applied to the slip system. The thermal stress increases as the cooling rate increases and as the size of $CaF_2$ crystal enlarges. While the calculation should consider thermal diffusivity, specific heat, Young's modulus, and Poisson's ratio, these values vary according to temperatures and crystal orientations, and thus it is desirable to calculate thermal stresses by considering respective temperature dependences and crystal orientation dependences. Moreover, uniformity etc. of the heat release from $CaF_2$ changes according to ambient conditions and thus it is preferable that the calculation considers influence of a cooler itself.

In the embodiment according to the present invention, the entire cylindrical surface of $CaF_2$ crystal was isothermal, and the maximum shear stress among thermal stress that is determined by the size of $CaF_2$ crystal and cooling rate is approximated as follows by considering parameters including thermal diffusivity, specific heat, Young's modulus, and Poisson's ratio of $CaF_2$ single crystal:

$$\tau_{MAX} = 9E-6 \cdot \exp(2E-3 \cdot T) \cdot D^2 \cdot R \quad (3)$$

where $\tau_{MAX}$ is the maximum shear stress [MPa], D is a thickness of crystal, R is a cooling rate, and T is temperature [K] of $CaF_2$.

By considering the maximum shear thermal stress given by Equation (3), a cooling rate was continuously varied so that the maximum shear thermal stress generated during the cooling process in anneal exhibited a certain ratio to CRSS in the primary slip system shown in Equation (1), and the effect was confirmed.

Figure 3:
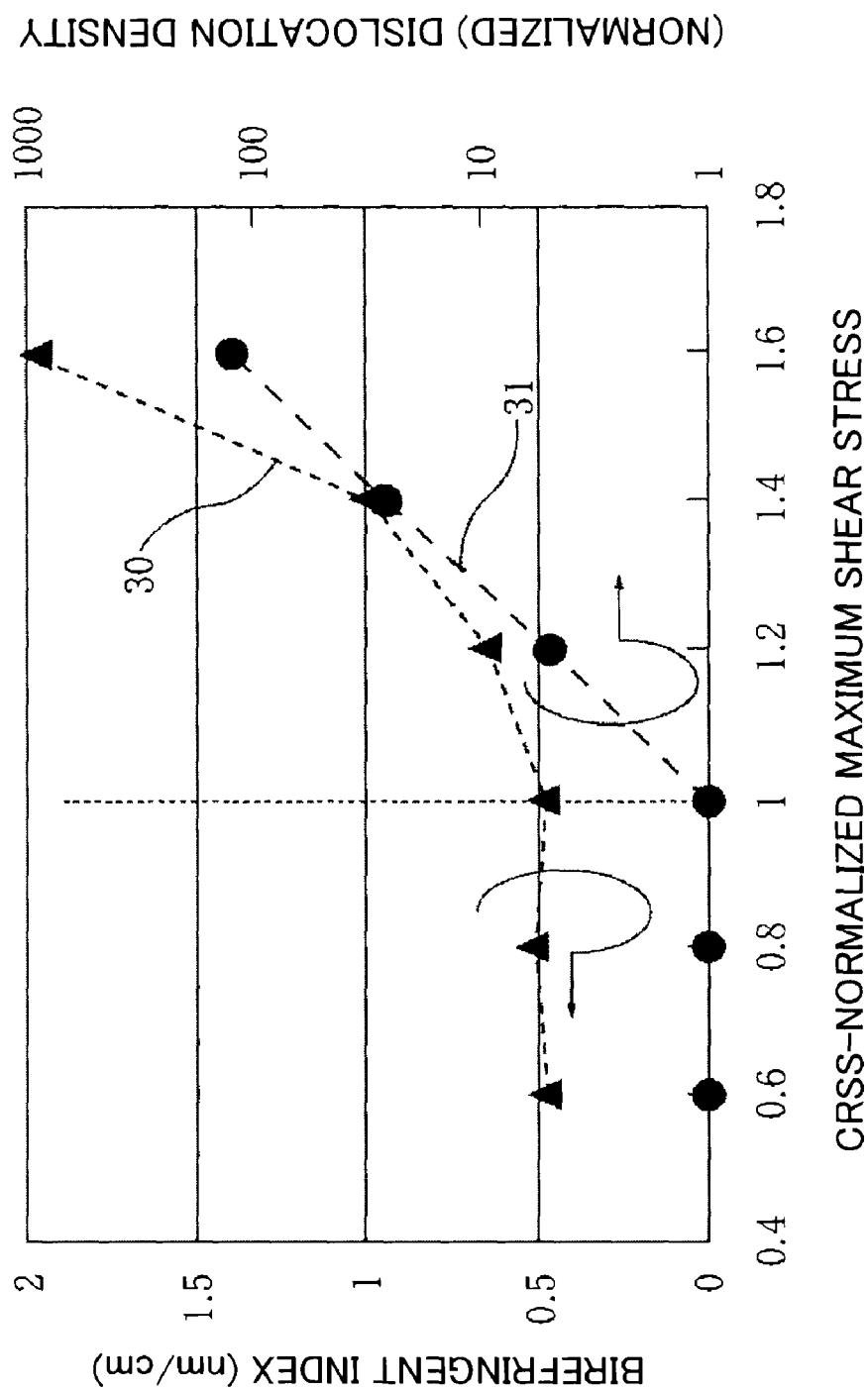
FIG. 3 is a graph showing birefringent index and dislocation density of CaF$_2$ single crystal that has been cooled so that the maximum shear stress may be at a constant ratio to critical resolved shear stress in its primary slip system.

FIG. 3 shows changes of birefringent index and dislocation density as a result of cooling so that the maximum shear stress obtained from Equation (3) occupies a certain ratio to CRSS in the primary slip system expressed by Equation (1). As shown in FIG. 3, when the maximum shear stress caused by the thermal stress is equal to or smaller than CRSS of the primary slip system, both the birefringent index 30 and dislocation density 31 become low constant values. On the other hand, when the maximum shear stress caused by the thermal stress is larger than CRSS of the primary slip system, the dislocation density 31 increases and the birefringent index 30 increases accordingly. This result indicates that an increase of crystal defect represented by dislocation relates to occurrence of stress birefringence.

Thus, by maintaining the maximum shear stress caused by the thermal stress below CRSS of $CaF_2$ as an object to be processed in a cooling process, plastic deformation is restrained in a cooling process after a heat treatment and $CaF_2$ having good birefringence may be manufactured. Continuous control over cooling rates so that the maximum shear thermal stress is such a certain ratio that it may be approximately equal to or smaller than CRSS of the primary slip system for each temperature during cooling may complete cooling within the shortest time while making the birefringence low, enhancing the productivity. Moreover, when the maximum shear stress calculated by Equation (3) is about 1.2 times as large as CRSS of the primary slip system, the birefringent index may be restrained below the substantially problematic amount, and the shortened cooling time provides the good productivity.

Effects of Deformation Tolerance of Calcium Fluoride

Figure 4:
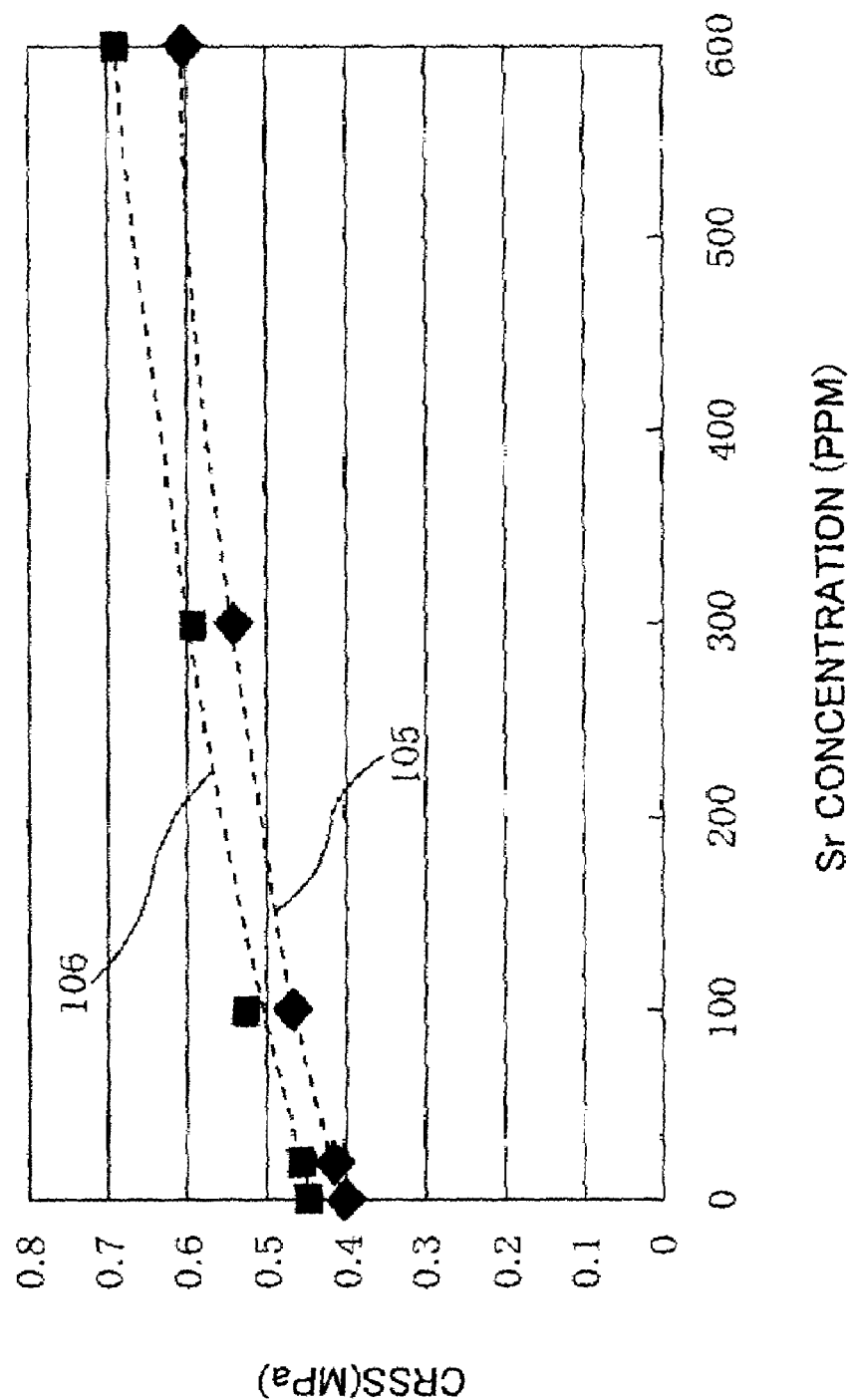
FIG. 4 is a graph showing exemplary changes of critical resolved shear stress at 600° C. of the {0 0 1}<1 1 0> slip system of CaF$_2$ single crystal measured by the present invention, to which Sr has been added.

FIG. 4 is a view showing a relationship between added strontium content and CRSS of the (primary) $\{0\ 0\ 1\}<1\ 1\ 0>$ slip system at 600° C. in $CaF_2$ single crystal of different purity which has experienced the above heat treatment without increasing the birefringence again. Table 2 shows respective major impurities other than strontium. Predetermined content of strontium is mixed with the $CaF_2$ material when the single crystal grows.

TABLE 2

| | (ppm) | | | | | | |
|---|---|---|---|---|---|---|---|
| | Na | Mn | Fe | Y | Ce | Ba | Mg |
| High Purity Material | <0.1 | <0.1 | 0.2 | <0.01 | <0.01 | 0.9 | 1.2 |
| Normal Purity Material | 0.5 | <0.1 | 5.1 | 0.2 | 0.1 | 28 | 17 |

As shown in FIG. 4, a relatively high purity material exhibited a characteristic line 105 among the strontium-added $CaF_2$ base material, while a normal purity material that includes impurities to some extent exhibited a characteristic line 106.

Table 3 shows coefficient "A" in each composition when the following equation expresses temperature dependency of CRSS in the {0 0 1}<1 1 0> slip system in $CaF_2$ single crystal:

$$\tau_c = A \cdot \exp(3E3 \cdot T^{-1}) \quad (4)$$

where $\tau_c$ is CRSS [MPa] and T is temperature [K].

TABLE 3

| Sr concentration (ppm) | 1 | 20 | 100 | 300 | 600 |
|---|---|---|---|---|---|
| High Purity Material | 1.3E-2 | 1.3E-2 | 1.5E-2 | 1.7E-2 | 2.0E-2 |
| Normal Purity Material | 1.4E-2 | 1.4E-2 | 1.7E-2 | 1.9E-2 | 2.2E-2 |

It is apparent in light of FIG. 4 that CRSS in the {0 0 1}<1 1 0> slip system improves in almost proportion to strontium content. CRSS similarly improves by a certain ratio by an addition of strontium of each concentration for other temperatures. It may be presumed that this is because strontium dissolved in $CaF_2$ single crystal and the resistance to the slip improved. An improvement of CRSS given an additive element may improve deformation tolerance of $CaF_2$. While such an improvement effect of CRSS occurs even when another element is added, strontium is particularly less influential on optical performance than other elements, as disclosed in Japanese Patent Application Publication No. 9-25532, and $CaF_2$ including strontium of 600 ppm is practically feasible. Therefore, strontium is an additive element appropriate to an improvement of deformation tolerance of $CaF_2$ single crystal for optics purposes. An addition of strontium shown in FIG. 4 does not cause a phenomenon in that the slip system changes.

Such an improvement of deformation tolerance of $CaF_2$ is effective to $CaF_2$ for optical elements for use with a light source having a short wavelength in which influence of the birefringence becomes remarkable, in particular, a manufacture of a $CaF_2$ lens for use with $F_2$ excimer laser as light having a wavelength near 157 nm. It is also effective toward improved productivity of a large aperture $CaF_2$ lens for high NA, such as an aperture of Φ 300 mm or larger, which needs extremely a low cooling rate in the cooling time.

Application to Manufacture Process $CaF_2$ having low birefringence and a little residual strain was obtained and a manufacture line having high productivity was built by optimizing annealing for $CaF_2$ based on information of the above series of research results. In addition, a temperature control process in the steps of processing, cleansing and forming antireflection coating of $CaF_2$ may use similar cooling to the above annealing, forming $CaF_2$ as a lens without deteriorating performance of $CaF_2$. Use of a thus manufactured $CaF_2$ lens for an optical system would provide an optical system having excellent contrast. In addition, use of an exposure apparatus including this optical system for an exposure step in device fabrication would be able to stably provide a precise exposure process.

First Embodiment

A description will be given of a heat treatment method of a first embodiment after $CaF_2$ single crystal grows.

Initially, a $CaF_2$ powder material was melted with scavenger and refined so as to improve purity and bulk density. Then, the Bridgman-Stockbarger process is used to adjust a crystal orientation of a seed crystal for crystal growth in a <1 1 1> direction. A proper amount of strontium was added upon crystal growth, and strontium content in the grown single crystal was adjusted. The grown $CaF_2$ single crystal was cut into a cylindrical shape with a diameter of 330 mm and a thickness of 60 mm, and set in a carbon vessel in an anneal kiln. $CaF_2$ single crystal is covered with a heat insulation material so as to make a surface temperature of $CaF_2$ uniform during heating and cooling processes, and to prevent non-uniform heat transmissions between $CaF_2$ subject to heat treatment and the kiln material due to contact with the kiln material, etc. The atmosphere in the kiln was drawn a vacuum, and then heated from room temperature to 1000° C. at 30° C./hour. Annealing at 1000° C. for 24 hours mitigated strain in the crystal.

The subsequent cooling step considers CRSS of the primary slip system ({0 0 1}<1 1 0>) in $CaF_2$ to be cooled using Equation (3), a size of crystal and maximum shear stress of the crystal to be cooled, and calculates a cooling rate for each temperature so that the maximum shear stress does not exceed CRSS. A description will be given of cooling of annealed $CaF_2$ single crystal of the instant embodiment using $CaF_2$ as an example that exhibits temperature dependency of CRSS expressed by Equation (1).

Equation (5) is calculated when the maximum shear stress that is obtained by substituting a size of crystal for Equation (3) is equalized to CRSS in Equation (1):

$$R = 0.46 \cdot \exp(3E3 \cdot T^{-1} - 2E - 3 \cdot T) \quad (5)$$

Equation (5) indicates a cooling rate for each temperature in a cooling process where the maximum shear stress is equal to CRSS of the primary slip system for each temperature. Equation (5) was input to a temperature controller in a heat treatment furnace for use with annealing, and the cooling rate given by Equation (5) according to temperatures of $CaF_2$ single crystal measured by a thermocouple, etc. was continuously changed for post-anneal cooling.

Figure 5:
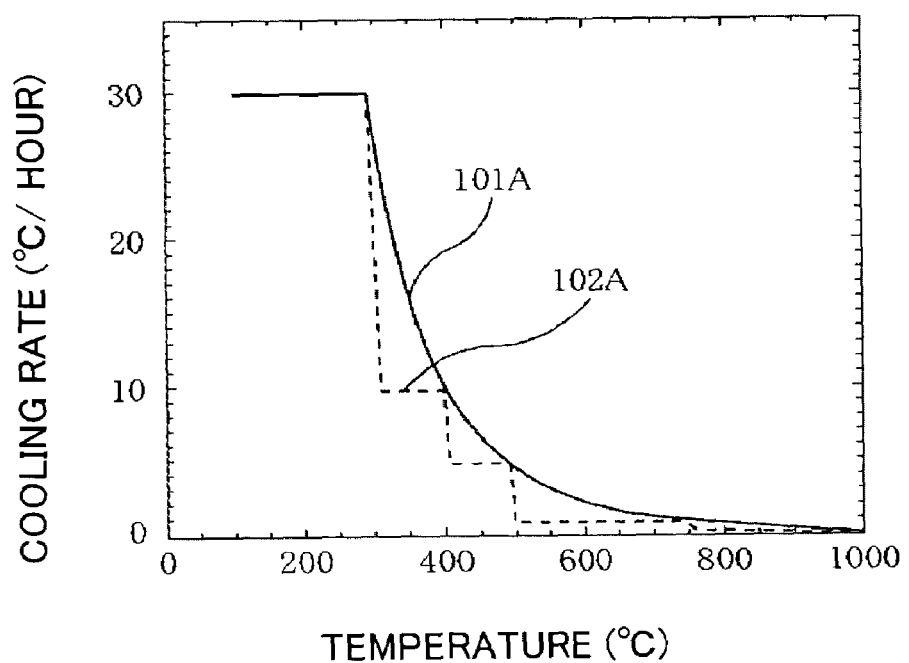
FIG. 5 is a graph that compares an exemplary post-anneal cooling rate according to the present invention with a conventional example.

FIG. 5 is a view showing a cooling rate 101A given by Equation (5) for each temperature, together with an exemplary cooling rate 102A calculated by the conventional empirical rule. Since the present invention thus identifies the maximum shear stress permissible in a non-deformable range for each temperature and a resultant cooling rate, the cooling rate may be continuously varied as shown in the line 101A shown in FIG. 5.

On the other hand, the prior art has empirically determined a permissible cooling rate through extensive tests and resultant birefringence amounts. Indeed, the prior art calculated cooling rates at several points in the temperature ranges for the cooling process. Even when the ideal cooling temperature was calculated for each temperature which may determine the cooling rate, the cooling rate inevitably became stepwise or discontinuous as shown in the conventional example 102A shown in FIG. 5. It was not guaranteed that the cooling rate empirically obtained for each temperature is below the permissible cooling rate, and thus the cooling rate should be lower than necessity in order to secure stable quality.

On the contrary, the instant embodiment may precisely calculate a cooling rate that starts generating plastic deformation due to the thermal stress, and may continuously increase the cooling rate as cooling progresses. The instant embodiment eliminates unnecessary margins and consequently enables cooling to end in almost the shortest time.

Figure 6:
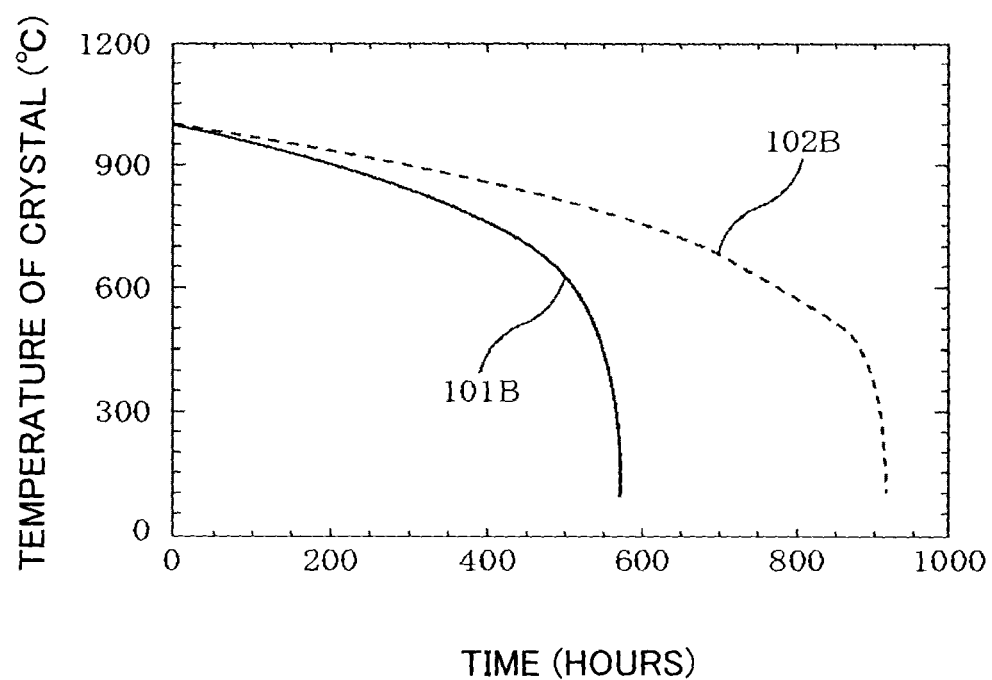
FIG. 6 is a graph that compares exemplary temperature variation of CaF$_2$ according to the present invention while it is cooled after anneal, with a conventional example.

FIG. 6 is a view showing temperature of $CaF_2$ single crystal over time when the $CaF_2$ single crystal is cooled at cooling rates shown in FIG. 5. A line 101B corresponds to cooling according to a line 101A shown in FIG. 5, which finishes in 575 hours as the shortest cooling time within a range of the permissible maximum shear stress. On the other hand, the line 102B shows that the cooling rate varies non-ideally, requiring extra time for cooling.

As discussed, the inventive cooling may avoid plastic deformation of $CaF_2$ single crystal subject to the thermal stress during cooling, and may provide control so as to minimize the residual strain after cooling, thereby lowering the birefringence amount. Moreover, the largest cooling rate is available within a range that does not cause the plastic deformation, and high-quality $CaF_2$ single crystal may be manufactured by good productivity and reproducibility.

When precise temperature control cannot always be expected due to temperature measurement errors, etc., use of Equation (6) in which the maximum shear stress given by Equation (3) becomes about 90% of CRSS in Equation (1) instead of Equation (5) would enable high-quality $CaF_2$ single crystal to be manufactured by good productivity and reproducibility:

$$R = 0.42 \cdot \exp(3E3 \cdot T^{-1} - 2E - 3 \cdot T) \quad (6)$$

As a result of measurements using light having a wavelength of 633 nm before and after annealing of $CaF_2$ single crystal cooled at a cooling rate given by Equations (5) or (6) after annealing, it was confirmed that the birefringence amount lowered from 3 nm/cm to 0.5 nm/cm within an average value of birefringence in an optical axis direction of $\Phi$ 330 mm.

Figure 7:
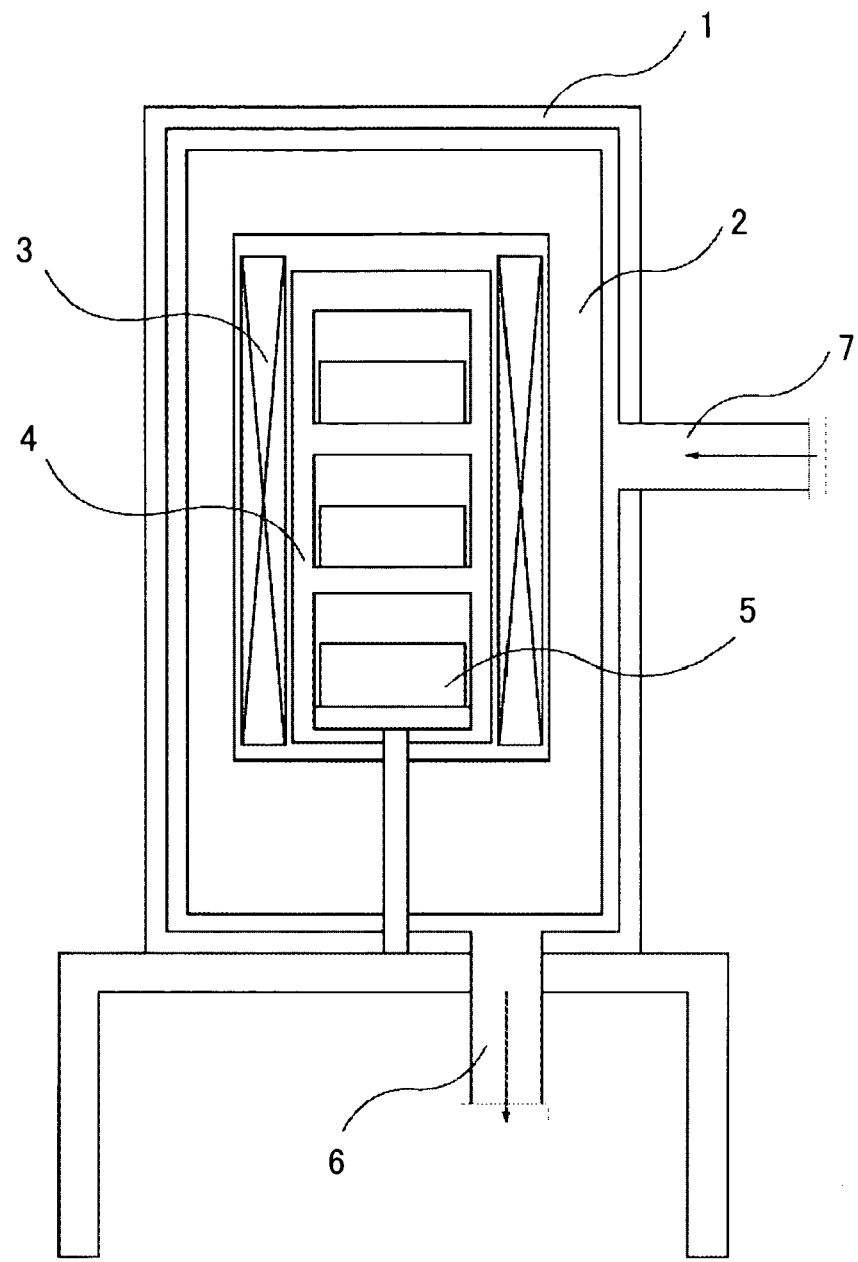
FIG. 7 is a schematic diagram showing an anneal apparatus according to the present invention.

The instant embodiment provides an anneal apparatus with a compulsory cooling mechanism so as to maintain a sufficient cooling rate particularly in a low temperature region below 300° C. FIG. 7 is a schematic view of the anneal apparatus used for the instant embodiment. In FIG. 7, 1 is a chamber in an anneal kiln, 2 is a heat insulation material, 3 is a heater, 4 is a crucible, 5 is $CaF_2$, and 6 is an exhaust system. An air introduction system 7 was provided as the compulsory cooling mechanism so as to enable a proper amount of temperature-controlled gas to be introduced into the chamber. Preferably, introduced gas is inert gas, such as Ar. A method for cooling $CaF_2$ with temperature controlled liquid, such as water, through a cooling pipe installed in the apparatus may be used instead of a method of introducing gas. A provision of such a compulsory cooling mechanism would provide sufficient cooling rate in the low temperature region, particularly below 300° C.

Such a compulsory cooling mechanism is applicable to purification and growth steps in crystal manufacture, as well as shape-processing, cleansing and film forming steps of crystal. This mechanism may sufficiently enhance a cooling rate in the low speed region, improving productivity.

Second Embodiment

A description will be given of a heat treatment to $CaF_2$ of a second embodiment.

According to the control of the first embodiment, the maximum shear stress in the cooling process does not exceed the CRSS of the primary slip system so as to completely eliminate deformation of $CaF_2$ single crystal subject to a thermal stress during cooling after annealing. However, when an increased amount of the resultant birefringence caused by any slight deformation is actually permissible in using $CaF_2$, it is advantageous for productivity purposes to use the cooling rate corresponding to the maximum shear stress that exceeds CRSS at a certain ratio.

Preferably, a permissible birefringence amount is mainly determined by a wavelength of a light source of an exposure apparatus that uses $CaF_2$ single crystal for a lens, for example, below 1 nm/cm for an ArF light source having a wavelength of 193 nm and below 0.7 nm cm for an $F_2$ light source.

While an empirical approach might be the only way of obtaining an amount of the birefringent index when the maximum shear stress exceeds, at various ratios, CRSS in the primary slip system in $CaF_2$ single crystal, the instant embodiment has discovered, as a result of various researches, that the birefringent index poses no working problem when the maximum shear stress is maintained about 1.2 times as large as CRSS.

In order to control cooling so that the maximum shear stress caused by a thermal stress in the cooling process is 1.2 times as large as CRSS in the primary slip system, the cooling process of $CaF_2$ single crystal having the same material and size as those of the first embodiment uses, for example, a cooling rate obtained from the Equation (7) in which the maximum shear stress given by Equation (3) is made as large as 120% of CRSS in Equation (1):

$$R = 0.55 \cdot \exp(3E3 \cdot T^{-1} - 2E - 3 \cdot T) \quad (7)$$

As a result of measurement using light having a wavelength of 633 nm before and after annealing of $CaF_2$ single crystal cooled at a cooling rate given by Equations (7) after annealing, it was confirmed that the birefringence amount lowered from 3 nm/cm to 0.7 nm/cm, which is a practically insignificant birefringent index within an average value of birefringence in an optical axis direction of $\Phi$ 330 mm.

Third Embodiment

A description will be given of a heat treatment to $CaF_2$ of a third embodiment.

A post-anneal cutting step for shaping $CaF_2$ single crystal into a lens maintains 300° C. or higher for cutting so as to prevent damages of $CaF_2$, because $CaF_2$ is hard and fragile in the low temperature region below 300° C. However, rapid heating and cooling in the steps of heating $CaF_2$ above 300° C., cutting the same, and then cooling the same would cause the maximum shear stress in $CaF_2$ to exceed CRSS in the primary slip system, generating plastic deformation. As a consequence, the strain increases, and the birefringence amount enlarges. The following process was designed to eliminate this problem.

For example, in cutting $CaF_2$ single crystal annealed in the first embodiment into a size of a diameter of 320 mm and a thickness of 60 nm, Equation (8) is available by equalizing to CRSS in Equation (1), the maximum shear stress obtained by substituting a size of crystal for Equation (3):

$$R = 0.46 \cdot \exp(3E3 \cdot T^{-1} - 2E - 3 \cdot T) \quad (8)$$

Equation (8) indicates a heating rate and a cooling rate for each temperature at which the maximum shear stress is equal to CRSS of the primary slip system. For temperature control, equation (8) was input to a temperature controller in a cutting machine, and the heating rate before cutting and the cooling rate after cutting were continuously varied by rates given by Equation (8) according to temperatures of $CaF_2$ single crystal measured by a thermocouple, etc. Such temperature control may maintain the maximum shear stress below CRSS of the primary slip system during the cutting process. Temperature control of $CaF_2$ at the time of cutting is also important; the temperature control over a retainer and a processing tool was conducted without causing a temperature distribution inside $CaF_2$. As a result of birefringence measurement using light having a wavelength of 633 nm before and after the cutting process in the instant embodiment, it was confirmed that the birefringence amount does not change from 0.5 nm/cm in an optical axis direction of Φ 320 mm.

The above process control method is applicable to grinding and polishing processes as well as the cutting process.

Fourth Embodiment

A description will be given of a heat treatment to $CaF_2$ of a fourth embodiment.

There is the step of cleansing a $CaF_2$ surface prior to the steps of forming antireflection coating and reflective coating. A surface absorption that results from organic deposit, residual abrasive and surface imperfection of $CaF_2$ is particularly a big issue in a vacuum ultraviolet region. In order to remove this surface absorption, $CaF_2$ is subject to a wet processing and a dry processing. In particular, the dry processing employs a processing method that causes temperature changes, such as ozone cleansing. Therefore, rapid heating and cooling in the cleansing process would cause the maximum shear stress in $CaF_2$ to exceed CRSS in the primary slip system, generating plastic deformation. The strain consequently increases, and the birefringence amount enlarges. The following process was designed to eliminate this problem.

Suppose that $CaF_2$ having a diameter of 300 mm and a maximum thickness of 50 mm obtained from the above series of steps is wet-cleansed, and then dry-cleansed by heating $CaF_2$ up to 400° C. in a dry cleaner. Equation (9) is obtained by equalizing to CRSS in Equation (1) the maximum shear stress obtained by substituting a size of crystal for Equation (3):

$$R = 0.67 \cdot \exp(3E3 \cdot T^{-1} - 2E - 3 \cdot T) \quad (9)$$

For temperature control, equation (9) was input to a temperature controller in a dry cleaner, and a heating rate before cleansing and a cooling rate after cleansing were continuously varied by rates given by equation (9) according to temperatures of $CaF_2$ single crystal measured by a thermocouple, etc. Such temperature control may maintain the maximum shear stress below CRSS of the primary slip system during cleansing. Temperature control of $CaF_2$ at the time of cleansing is also important, and a retainer, a dry cleansing tool condition, etc. were controlled so as not to cause a temperature distribution inside $CaF_2$. As a result of measurement of the birefringence using light having a wavelength of 633 nm before and after cleansing in the instant embodiment, it was confirmed that the birefringence amount does not change from 0.5 nm/cm in an optical axis direction of Φ 300 mm.

Fifth Embodiment

A description will be given of a heat treatment to $CaF_2$ of a fifth embodiment.

The steps of forming antireflection coating and reflective coating on a $CaF_2$ surface maintain the temperature of $CaF_2$ from about 200° C. to about 400° C. for better coating characteristics, and form a coating through resistance-heating evaporation, electron-beam evaporation, and sputtering. Rapid heating and cooling in the coating process would cause the maximum shear stress in $CaF_2$ to exceed CRSS in the primary slip system, generating plastic deformation. The strain consequently increases, and the birefringence amount enlarges. The following process design was conducted to overcome this problem.

Suppose that $CaF_2$ having a diameter of 300 mm and a maximum thickness of 50 mm obtained from the above series of steps is accommodated in a coating apparatus. Equation (9) is applicable to a coating process of magnesium fluoride at 400° C. by evaporation.

For temperature control, equation (9) was input to a temperature controller in a coating apparatus for $CaF_2$ single crystal, and a heating rate before a coating and the cooling rate after the coating were continuously varied by rates given by Equation (9) according to temperatures of $CaF_2$ single crystal measured by a thermocouple, etc. Such temperature control may maintain the maximum shear stress below CRSS of the primary slip system during the coating process. Temperature control of $CaF_2$ at the time of coating is also important, and a retainer, an arrangement of a heater, etc. were controlled so as not to cause a temperature distribution inside $CaF_2$. As a result of measurement of the birefringence using light having a wavelength of 633 nm before and after the coating process in the instant embodiment, it was confirmed that the birefringence amount does not change from 0.5 nm/cm in an optical axis direction of Φ 300 mm.

Sixth Embodiment

A description will be given of a heat treatment to $CaF_2$ of a sixth embodiment.

As discussed, control over a temperature variation rate so that thermal stress inside $CaF_2$ single crystal does not substantially exceed CRSS of the primary slip system, is effective in preventing an increase of birefringent index in heating and cooling $CaF_2$ single crystal. However, as an optical element made of $CaF_2$ single crystal used for an exposure apparatus becomes larger, the cooling rate should be lowered to maintain the thermal stress constant. As a wavelength of a used light source becomes shorter, influence of the birefringence increases and the precise temperature control becomes required. In particular, in controlling post-anneal cooling for an optical element that is made of $CaF_2$ single crystal and has a large aperture of Φ 300 mm or larger, a cooling rate in a high temperature region becomes 0.5° C./hour or smaller, the productivity deteriorates and the temperature control begins to pose problematic precision. In particular, an optical element for $F_2$ laser light source having a short wavelength is subject to influence of changes of birefringent index with even slight erroneous temperature control.

In order to eliminate these problems, improved CRSS of the slip system in $CaF_2$ single crystal and increased permissible thermal stress are effective. A description will be given of manufacture of a high-quality optical element by improving deformation tolerance of $CaF_2$ single crystal.

As shown in FIG. 4, CRSS in the {0 0 1}<1 1 0> slip system as the primary slip system increases as the strontium content increases in $CaF_2$ single crystal. Equation (10) is an equation that defines temperature dependency of CRSS in the {0 0 1}<1 1 0> slip system of $CaF_2$ single crystal that contains 600 ppm of strontium.

$$\tau_c^{1st} = 2.0E{-}2 \cdot \exp(3E3 \cdot T^{-1}) \quad (10)$$

Where $\tau_c$ is CRSS [MPa] and T is temperature [K].

When the strontium content is 100 ppm, Equation (10) exhibits CRSS that is about 1.3 times as large as that in Equation (1). As disclosed in Japanese Patent Application Publication No. 9-255328, strontium of about 600 ppm in $CaF_2$ does not negatively affect the optical performance of $CaF_2$.

Suppose that $CaF_2$ single crystal which has a cylindrical shape with a diameter of 330 mm and a maximum thickness of 60 mm, is manufactured similar to the first embodiment, and includes strontium of 500 ppm, is cooled after annealing. Equation (11) is obtained by equalizing to CRSS in Equation (10) the maximum shear stress obtained by substituting a size of crystal in Equation (3):

$$R = 0.62 \cdot \exp(3E3 \cdot T^{-1} - 2E{-}3 \cdot T) \quad (11)$$

Equation (11) was input to a temperature controller in a heat treat furnace, and the cooling rate was continuously varied for post-anneal cooling by the cooling rate given by Equation (11) according to temperatures of $CaF_2$ single crystal measured by a thermocouple, etc.

As a result of measurements using light having a wavelength of 633 nm before and after annealing of $CaF_2$ single crystal cooled at a cooling rate given by Equations (11) after annealing, it was confirmed that the birefringence amount lowered from 3 nm/cm to 0.5 nm/cm within an average value of birefringence in an optical axis direction of Φ 330 mm. The time period necessary for cooling was about 575 hours in the first embodiment, while it was about 431 hours in the instant embodiment. The cooling rate at the cooling start time at 100° C. was able to increase from 0.38° C./hour to 0.51° C./hour.

Thus, an addition of strontium as a third element in addition to fluorine and calcium that make of $CaF_2$ may improve CRSS in the primary slip system of $CaF_2$ single crystal, thereby shortening a post-anneal cooling time while maintaining the optical performance of $CaF_2$ after annealing, and improving controllability with an improved cooling rate. Preferably, the added element amount is larger for improvement of CRSS, in particular, above 100 ppm. The added element is not limited to strontium as far as the addition does not deteriorate the optical performance.

Seventh Embodiment

A description will be given of an exposure apparatus that uses $CaF_2$ for an optical system of one embodiment according to the present invention.

Figure 8:
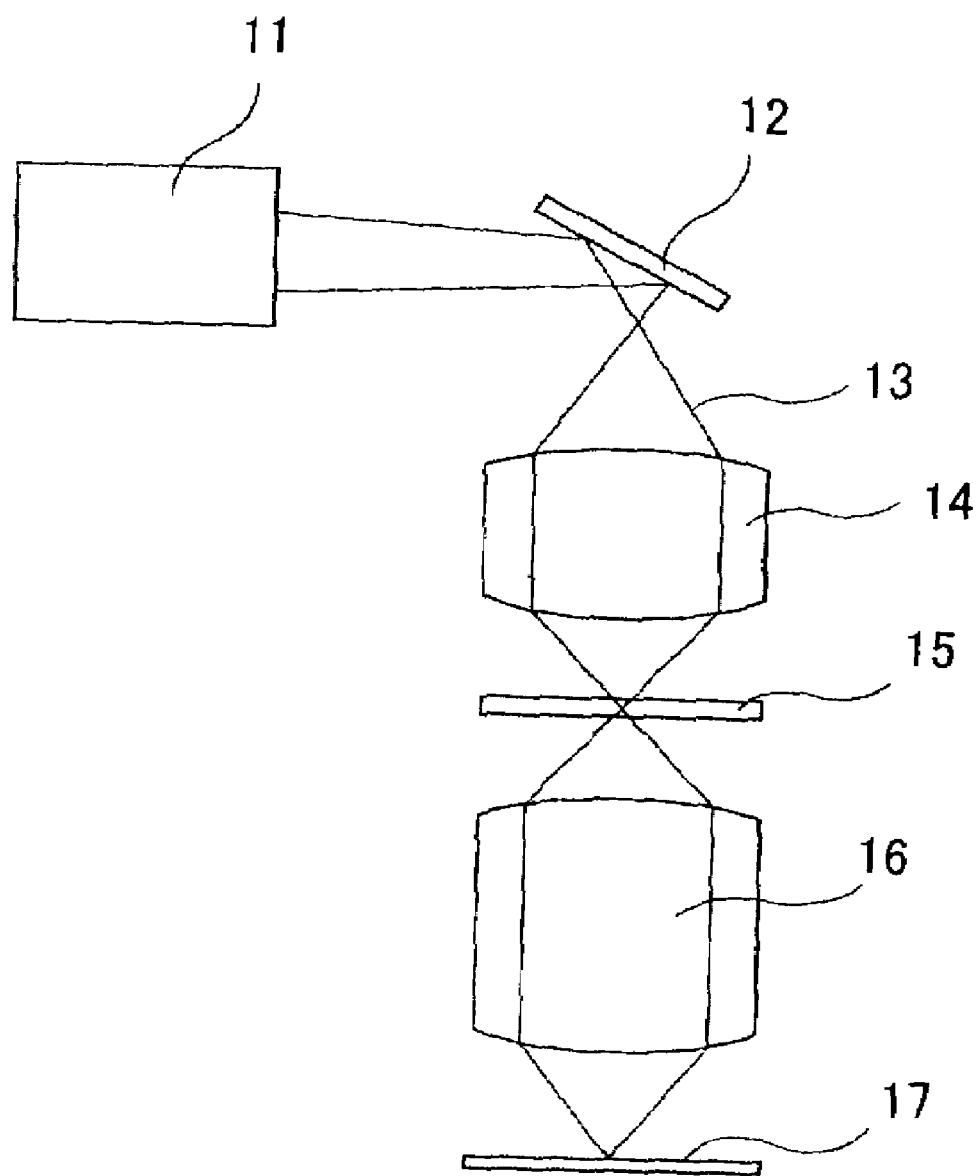
FIG. 8 is a schematic diagram showing an optical system in an inventive exposure apparatus used to manufacture semiconductors.

FIG. 8 shows a schematic diagram of an optical system in the exposure apparatus of the instant embodiment. 11 is an ultraviolet light source, such as KrF, ArF, $F_2$ and $Ar_2$ laser. A beam 13 from the light source 11 is introduced into an illumination optical system 14 through a mirror 12, and light that passes through the illumination optical system illuminates a reticle 15 as a first object. The light having information of the reticle 15 is projected onto a photosensitive plate 17 through a reduction projection optical system 16.

The illumination and projection optical systems in the exposure apparatus of the instant embodiment use $CaF_2$ prepared by the inventive heat treatment method. Since inventive $CaF_2$ has lower birefringence than conventional $CaF_2$, good imaging performance with high contrast may be obtained. Therefore, use of the exposure apparatus of the instant embodiment would be able to transfer a fine and clear pattern onto a photosensitive plate.

Eighth Embodiment

A description will be given of a manufacture method of semiconductor devices using the inventive exposure apparatus.

Figure 9:
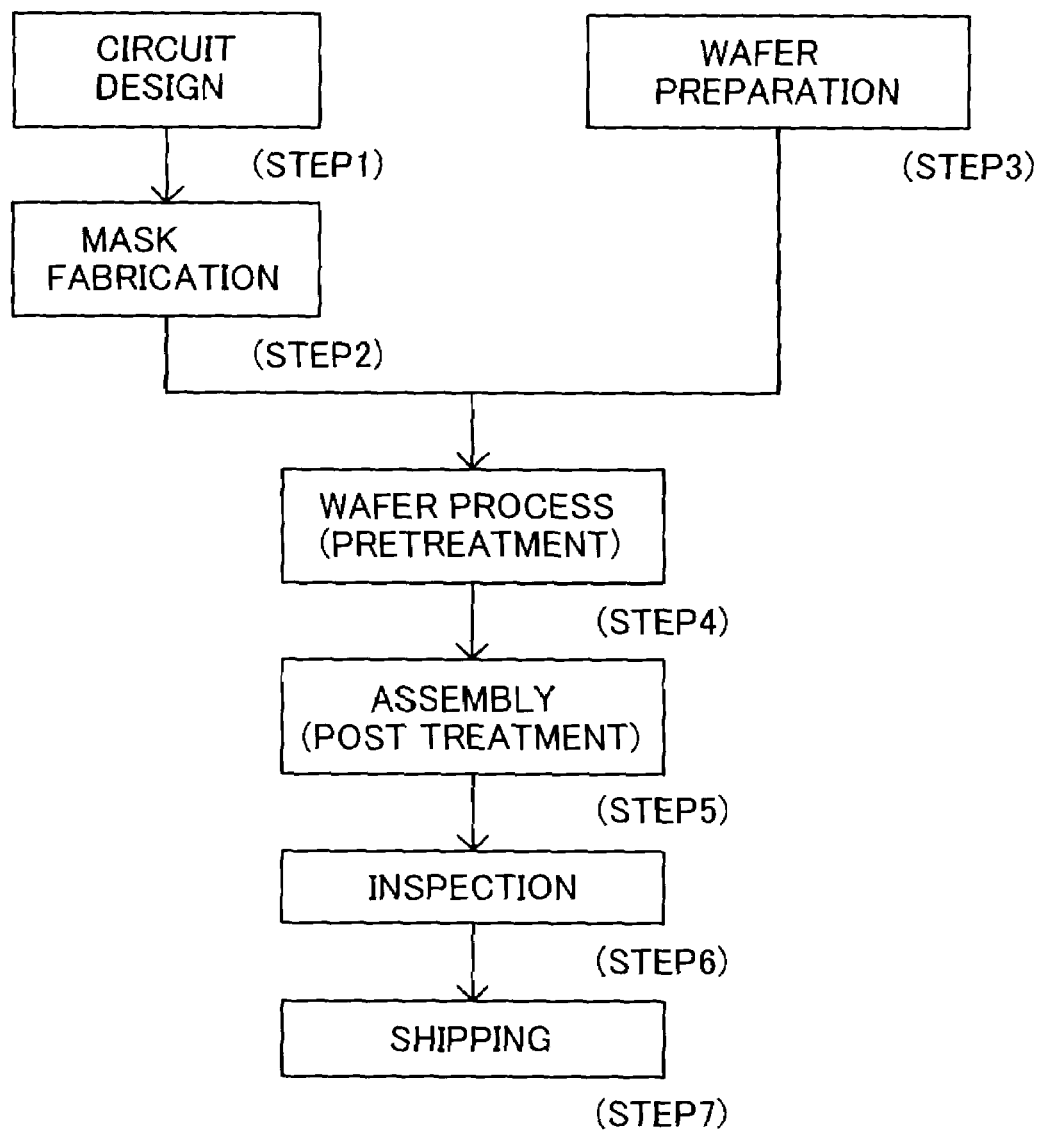
FIG. 9 is a flowchart for explaining a manufacture method of devices (e.g., semiconductor chips such as IC and LSI, LCD, CCD, and the like).

FIG. 9 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 10:
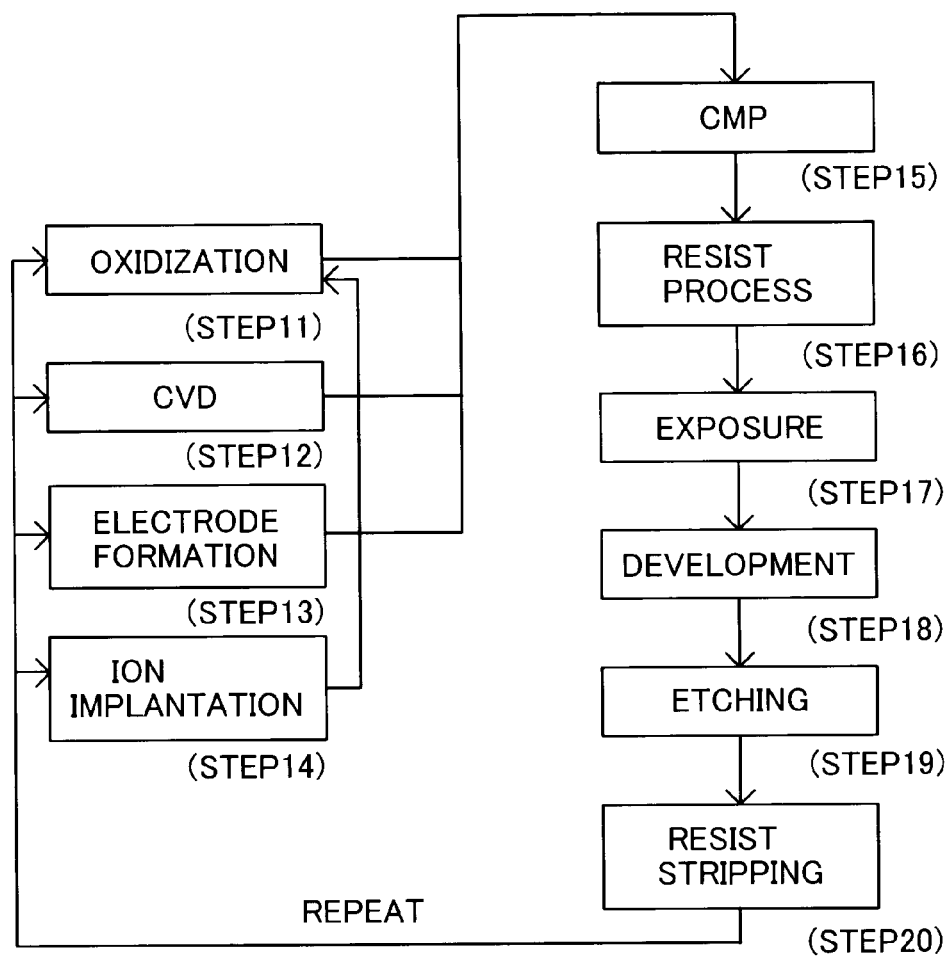
FIG. 10 is a detailed flowchart of the step 104 shown in FIG. 9.

FIG. 10 is a detailed flowchart of the wafer process in Step 4 in FIG. 9. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 polishes and flattens a surface of the wafer using chemical mechanical polishing machine.

Step 16 (resist process) applies a photosensitive material onto the wafer. Step 17 (exposure) uses the inventive exposure apparatus to expose a circuit pattern on the mask onto the wafer. Step 18 (development) develops the exposed wafer. Step 19 (etching) etches parts other than a developed resist image. Step 20 (resist stripping) removes disused resist after etching. These steps are repeated, and multilayer circuit patterns are formed on the wafer. The device fabrication method of this embodiment may manufacture a higher quality device than the conventional method. Claims for a device fabrication method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Use of the inventive manufacture method for wafer processing would be able to manufacture highly integrated semiconductor devices, which have been hard to be manufactured.

As discussed, a basic cooling condition that does not generate birefringence is clarified by paying attention to a mechanism that increases the birefringent index in the cooling process, and a manufacture method that stably manufactures $CaF_2$ of good quality with good productivity may be provided.

$CaF_2$ having a large size which is likely increase birefringence may be manufactured with high quality and good productivity.

In addition, the present invention may provide an optical system made of thus prepared $CaF_2$ having excellent contrast, an exposure apparatus using the same, and a device fabrication method using the exposure apparatus for a manufacture step.

What is claimed is:

1. A method for manufacturing calcium fluoride single crystal comprising the step of cooling the calcium fluoride single crystal so that maximum shear stress inside the calcium fluoride single crystal caused by thermal stress is approximately equal to or smaller than critical resolved shear stress ($\tau_c$) of the calcium fluoride single crystal in a <1 1 0> direction on a {0 0 1} plane of the calcium fluoride single crystal.

2. A method for manufacturing calcium fluoride single crystal comprising the step of cooling the calcium fluoride single crystal with variable cooling rates so that throughout temperature in said cooling step, maximum shear stress inside the calcium fluoride single crystal caused by thermal stress is approximately equal to or smaller than critical resolved shear stress ($\tau_c$) of the calcium fluoride single crystal in a <1 1 0> direction on a {0 0 1} plane of the calcium fluoride single crystal and maintained to be an approximately constant ratio.

3. A method for manufacturing calcium fluoride single crystal comprising the step of cooling the calcium fluoride single crystal so that maximum shear stress inside the calcium fluoride single crystal caused by thermal stress is 1.2 times as large as a critical resolved shear stress ($\tau_c$) of calcium the fluoride single crystal or smaller in a <1 1 0> direction of on a {0 0 1} plane of the calcium fluoride single crystal.

4. A method for manufacturing calcium fluoride single crystal comprising the step of cooling the calcium fluoride single crystal with variable cooling rates so that throughout temperature in said cooling step, maximum shear stress inside the calcium fluoride single crystal caused by thermal stress is 1.2 times as large as critical resolved shear stress ($\tau_c$) of the calcium fluoride single crystal or smaller in a <1 1 0> direction on a {0 0 1} plane of the calcium fluoride single crystal and maintained to be an approximately constant ratio.

5. A method according to any one of claims 1 to 4, wherein said cooling step is included in one of a cooling step after crystal growth, a cooling step after annealing, a cooling step after mechanical processing of crystal, a cleansing step of a crystal surface, or a coating step to a crystal surface.

* * * * *

UNITED STATES PATENT AND TRADEMARK OFFICE
CERTIFICATE OF CORRECTION

| | | |
|---|---|---|
| PATENT NO. | : 7,105,049 B2 | |
| APPLICATION NO. | : 10/657166 | |
| DATED | : September 12, 2006 | |
| INVENTOR(S) | : Keita Sakai | |

It is certified that error appears in the above-identified patent and that said Letters Patent is hereby corrected as shown below:

ON THE COVER PAGE:
    In item "(57) ABSTRACT," line 1, "for" should read -- of -- and "calcium" should read -- a calcium --.
    In item "(57) ABSTRACT," line 6, the first occurrence of "of" should be deleted.

COLUMN 1:
    Line 12, "crystal and $CaF_2$" should be deleted.
    Line 13, "single" should be deleted.
    Line 18, "No end to a" should read -- A --.

COLUMN 2:
    Line 54, the first occurrence of "of" should be deleted.
    Line 63, "of" should be deleted.

COLUMN 3:
    Line 5, the first occurrence of "of" should be deleted.
    Line 14, the first occurrence of "of" should be deleted.
    Line 33, the first occurrence of "of" should be deleted.
    Line 38, "may" should be deleted.
    Line 39, "have" should read -- having --.

COLUMN 5:
    Line 3, "unveild" should read -- unveiled --.
    Line 21, "Burgers" should read -- Burger's --.
    Line 22, "was" should read -- were --.

COLUMN 10:
    Line 52, "damages" should read -- damage --.

COLUMN 14:
    Line 50, "be able to manufacture" should read -- enables the manufacturing of --.

UNITED STATES PATENT AND TRADEMARK OFFICE
CERTIFICATE OF CORRECTION

PATENT NO. : 7,105,049 B2  Page 2 of 2
APPLICATION NO. : 10/657166
DATED : September 12, 2006
INVENTOR(S) : Keita Sakai It is certified that error appears in the above-identified patent and that said Letters Patent is hereby corrected as shown below:

COLUMN 16:
  Line 3, "calcium the" should read -- the calcium --.

Signed and Sealed this

Twenty-fourth Day of April, 2007

JON W. DUDAS
*Director of the United States Patent and Trademark Office*